United States Patent [19]
Fett

[11] 3,984,702
[45] Oct. 5, 1976

[54] N-BIT REGISTER SYSTEM USING CML CIRCUITS

[75] Inventor: Darrell L. Fett, Scottsdale, Ariz.

[73] Assignee: Honeywell Information Systems, Inc., Phoenix, Ariz.

[22] Filed: Dec. 2, 1975

[21] Appl. No.: 636,861

[52] U.S. Cl. .............................. 307/238; 307/213; 307/218; 307/221 R; 307/290
[51] Int. Cl.² .................. H03K 19/22; G11C 19/28
[58] Field of Search .......... 307/208, 213, 218, 238, 307/221 R, 290, 215; 340/173 FF

[56] References Cited
UNITED STATES PATENTS

| | | | |
|---|---|---|---|
| 3,535,546 | 10/1970 | Davis | 307/218 X |
| 3,539,824 | 11/1970 | Yu et al. | 307/218 |
| 3,612,911 | 10/1971 | Kroos | 307/218 X |
| 3,760,190 | 9/1973 | Hannaford | 307/218 |

*Primary Examiner*—John Zazworsky
*Attorney, Agent, or Firm*—William W. Holloway, Jr.; Nicholas Prasinos; Ronald T. Reiling

[57] ABSTRACT

The invention discloses basic current mode logic (CML) circuits which function as feedback latches. One embodiment of the latch is a circuit for storing an input data signal. An alternative embodiment of the latch is a circuit which performs an And/Or function on a plurality of input data signals and then stores the result. The latch embodiments may be combined to form register systems. One combination of latch circuit provides a basic component for a shift register wherein a simple clocking system is utilized to provide a built-in delay mechanism required for proper operation of the shift register.

12 Claims, 9 Drawing Figures

N-BIT REGISTER SYSTEM USING CML CIRCUITS

BACKGROUND OF THE INVENTION

1. Field of the Invention

The present invention relates generally to high-speed logic circuits for use in data processing systems and in particular to CML circuit designs for implementing storage and logical registers for said data processing systems.

2. Description of the Prior Art

The evolution of electronic data processing systems has inextricably trended towards faster and more reliable systems. As part of this trend the various components used for assemblying said data processing systems have similarly evolved towards smaller, faster and denser parts. One such part affected by this evolutionary process is the working storage element or register.

The register function is notoriously old in the art: in response to control signals, the register must store a bit (or bits), of data. A register system may include means for storing a plurality of bits in parallel. Alternatively, register system may be designed serially such that it forms a shift register. If a register is built with a feedback loop such that it continues to store the data until signalled to do otherwise, the register is sometimes referred to as latch.

Current mode logic (CML) offers a relatively new circuit design technology for providing high-speed, high-density electronic parts such as registers. A prior art CML register is described in U.S. Pat. No. 3,514,640, issued Feb. 3, 1967 to D. L. Fett. However, there is a need for a CML register circuit which could be produced on a semiconductor chip of higher density. Also there is the need for a pulse generation scheme for control of input and output of data from the register system. If properly designed, a pulse generation scheme could enhance the operating characteristics of the register system as well as make it more useful as a building block within data processing systems.

OBJECTS OF THE INVENTION

It is an object of the present invention therefore to provide an improved register system using CML circuit design.

It is another object of the present invention to provide a CML register which includes an improved pulse generation scheme.

It is another object of the present invention to provide an N-bit And/OR CML resiter system.

It is still another object of the present invention to provide an N-bit Master/Slave register system for use in a serial register.

Other objects and benefits will become apparent from the following description of the preferred embodiment of the invention when read in conjunction with the drawings contained herewith.

SUMMARY OF THE INVENTION

The invention comprises current mode logic (CML) circuits for a register which functions as a feedback latch. The register circuits include gates comprised of groups of transistors with commonly connected collectors. Similarly, the gates are also designed with shared resistors for enhancing their density characteristics. One of the register gates provide the latching function by having its output signal fed back to one of its inputs. The gates are clocked by clock signals sent to the data input gates and the complement of said clock signal sent to the latching feedback gate.

One embodiment of the latch includes a single data input gate and a latching gate and stores either a single data input or the AND function of several data input signals. An alternative embodiment of the latch includes a plurality of data input gates and a single latching gate and performs an And/Or function on a plurality of data input signals prior to storing the result.

These embodiments of the latch may be combined to form register sytems. One combination of the latching register circuit provides the basic components (i.e. bit cells) for a shift registers. This shift register includes a simple clocking system which provides a built-in delay mechanism for proper operation of the shift register.

Brief Description of the Drawings

FIG. 1b is a circuit diagram for implementing the latching register shown in FIG. 1a;

Description of a Preferred Embodiment

Figure 1A:
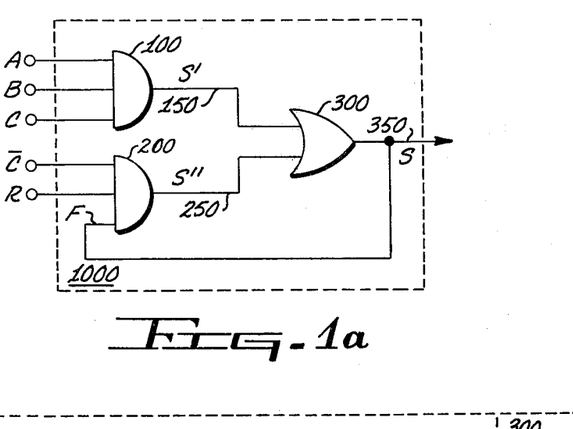
FIG. 1a is a logic diagram of the basic latching register of the present invention.

Refer now to FIG. 1a in which latching register 1000 is shown. Register 1000 is comprised of AND-gates 100 and 200 with their output signals S' and S'' respectively connected by lines 150 and 250 respectively to input terminals of OR-gate 300. The output signal S from OR-gate 300 is provided over line 350 and is also used as a feedback signal F to AND-gate 200. AND-gate 200 also receives a reset signal R and a clock signal $\overline{C}$ at its output terminals. AND-gate 100 receives a complementary clock signal C and data signals A and B at its input terminals. It is noted that although two data input signals A and B are used in the present embodiment, this is merely illustrative and a different number of data input signals could be used as described below.

Figure 1B:
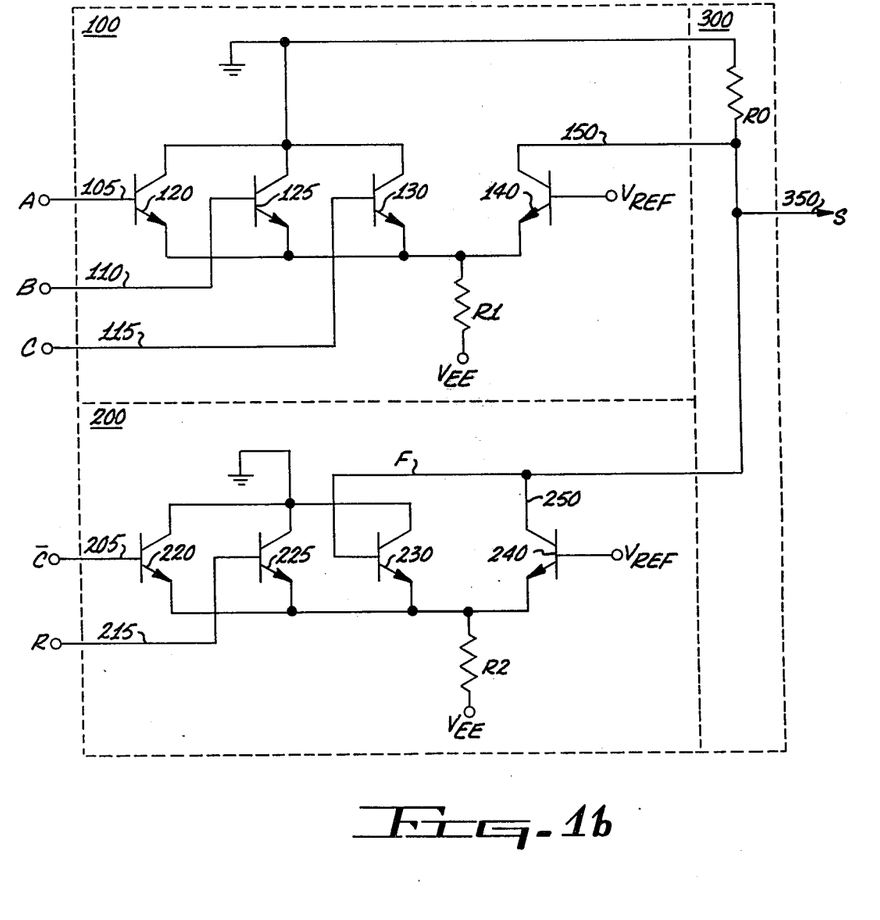

Referring now to FIG. 1b, a circuit diagam for implementing register 1000 is shown. Identical letters and numbers in the drawings refer to identical parts and signals. Input signals A, B and C are provided over lines 105, 110 and 115, respectively, to the bases of transistors 120, 125 and 130, respectively. Transistors 120, 125 and 130 have commonly connected collectors coupled to ground and commonly connected emitters coupled through R1 to $V_{EE}$ (which in the present embodiment is −3.3 volts). This structure of commonly connected transistors with their bases responsive to different input signals provides the input terminal structure for an AND-gate. It is noted that the design of a circuit with commonly connected collectors which performs required functions provides an essential feature of the present invention. In particular, this feature allows for high density semiconductor chips for the circuit by using well-known fabrication processes for semiconductor chips, as discussed infra.

A register with a different number of data input terminals may also be provided. If only a single data input signal is required (instead of two as shown in FIGS. 1a and 1b), input Signal B, line 110, and transistor 125 may be deleted from the circuit. Alternately, if additional data signals are required, additional input lines and corresponding transistors may be included in the circuit. Gate 100 is a current mode logic gate. It is required to have a transistor for providing an alternate current path (i.e., alternate to the path through 120, 125 and/or 130) from ground through R1 to $V_{EE}$. Transistor 140 provides this function with its emitter connected by R1 to $V_{EE}$, its collector connected through RO to ground, and its base connected to $V_{REF}$. In the present embodiment $V_{REF}$ is —0.26 volts.

As stated, current must flow through trransistor 140 or through at least one of transistors 120, 125 and 130. A voltage differentiator effect is achieved by these alternate current paths. If all of signals A, B and C are low, then transistor 140 will be turned on. Current will flow from ground through the path provided by resistor RO, line 150, transistor 140 and R1 to $V_{EE}$. In this manner, a voltage drop will occur across RO and the output signal corresponding to the voltage level on line 150 will be low (with respect to ground). Correspondingly, if any of the input signals A. B or C is high, the base of the corresponding transistor will be high with respect to the base of transistor 140 and that transistor will therefore be turned on. Current will flow through the path provided by the appropriate one (or more) of transistors 120, 125 and 130, through resistor R1 to $V_{EE}$, instead of travelling through resistor RO and transistor 140. There will no longer be a voltage drop across RO and the output signal (or line 150) will be high. In this manner an AND-gate is achieved.

It is noted that the negative logic convention is used wherein a 0 corresponds to ground and a 1 corresponds to a negative voltage signal. The negative voltage signal must be negative with respect to $V_{REF}$. In the preferred embodiment, the negative signal is approximately —0.5 volts.

Gate 200 is similar to gate 100. Signals $\overline{C}$ and R are sent over lines 205 and 215 respectively to the bases of transistors 220 and 225 respectively. Signal F is sent over line 250 to the base of transistor 230. Transistor 220, 225 and 230 have commonly connected collectors coupled to ground and commonly connected emitters coupled through R2 to $V_{EE}$. The reference transistor 240 has its base connected to $V_{REF}$, its emitter coupled through R2 to $V_{EE}$ and its collector coupled through RO to ground. Line 250 connected to the collector of transistor 240 is the output line for gate 200. Line 250 is also connected to the base of transistor 230 such that feedback loop is provided to the gate. Operation of the circuit is similar to gate 100 except for the feedback mechanism.

In the present embodiment OR-gate 300 is considered to be comprised of resistor RO coupled between ground and the output line 150 of gate 100, also coupled between ground and line 250 of gate 200. Lines 150 and 250 are connected to line 350, the output line of OR-gate 300 and of the register 1000 for carrying the output signal S. It is emphasized that this conception of OR-gate 300 is somewhat arbitrary and unessential to the precise workingsof the circuit and is given to assist in understanding the correspondence between FIGS. 1a and 1b. Other concepts for the components of OR-gate 300 are envisioned without departing from the scope of the present invention.

Figure 1C:
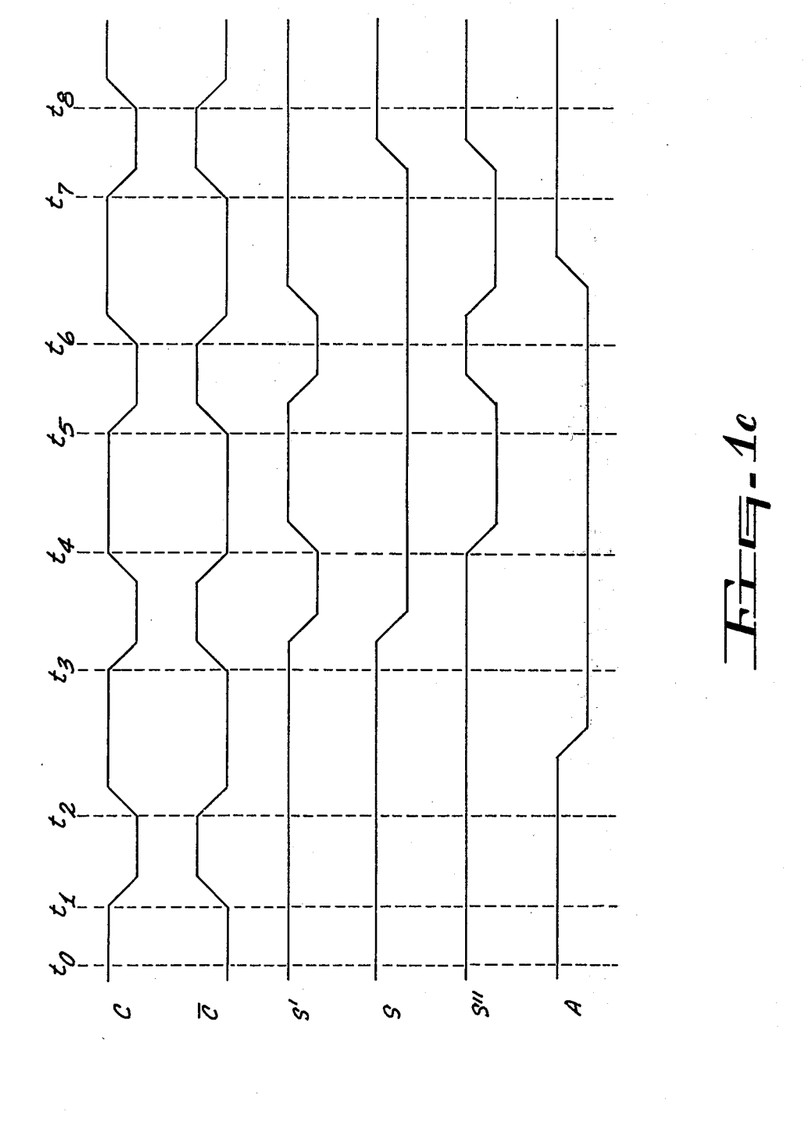
FIG. 1c is a timing diagram which explains the operation of the circuit shown in FIG. 1b.

Referring now to FIG. 1c, a timing diagram for the circuit described in conjunction with FIG. 1b is shown. It is noted that FIG. 1c shows only one data input signal A, whereas FIGS. 1a and 1b show two input signals, A and B. However, as described above, gate 100 is an AND-gate and its response to input signals A and B by corresponding transistors 120 and 125 is identical. Therefore, only line A is shown in FIG. 1c. This line may be considered as the result of an AND between two or more input signals (noting that the negative logic convention is used).

There are four logical possibilities for the effect of the input signal on the circuit, dependent on the previous state of the circuit. These combinations are 0 stored, 0 input; 0 stored, 1 input; 1 stored, 1 input; and 1 stored, 0 input. Referring now to FIG. 1c, the system is first described at $t0$. Clock signals C and $\overline{C}$ are always complementary. In a steady state, C is high, meaning A "0", and $\overline{C}$ is low, meaning a "1". Accordingly, current normally flows through transistor 130. Correspondingly, no current flows through transistor 140 (and resistor RO due to transistor 140) so output signal S' or line 150 of gate 100 is high, that is a "0". Similarly since $\overline{C}$ is low, current does not flow through transistor 220. The reset signal R is normally in a low state so current does not flow through transistor 225. Therefore, in this state the controlling output to gate 200 is signal S" through feedback terminal F to transistor 230. It is assumed that at $t0$ the output signal S is a "0" (high) and therefore current runs from ground through transistor 230 and resistor R2 to $V_{EE}$. Accordingly, transistor 240 is off. This is a steady state for the system.

Data input signal A is assumed to be a "0". Both transistors 120 and 130 will therefore be on. At t1, clocks C and $\overline{C}$ shift to low and high respectively, which enables the new data input signal to be stored in the latching register 1000. Transistor 130 turns off in response to signal C going low. Current no longer runs through transistor 130, but continues to run through transistor 120. There will be no effect on transistor 140 nor on output signal S'. Similarly the changing of signal $\overline{C}$ turns transistor 220 on. This will not affect transistor 240 however, which is already off due to transistor 230 being on. When signals C and $\overline{C}$ return to their steady state condition at $t2$, transistor 130 turns "on" and transistor 220 turns off. No change results in any of the signals S, S' or S".

Some time between $t2$ and $t3$ it is assumed that data input signal A changes from a 0 to a 1 (that is, it goes low). It is noted that although input signal A goes low and thus transistor 120 is turned off, current still does not flow through transistor 140 due to the holding of transistor 130 on by signal C (high). At t3 signal C goes low and $\overline{C}$ goes high. With both A and C low, transistors 120 and 130 are both off and transistor 140 turns on. Current flows through resistor RO and signal S', and therefore also signal S, goes low. The S signal is fed back to the base of transistor 230 and turns transistor 230 off. Transistor 240 would turn on, but for the $\overline{C}$ signal being high. At time $t4$ $\overline{C}$ goes low, causing transistor 240 to turn on and the S" signal to go low. Correspondingly C goes high, turning transistor 130 on and transistor 140 off. S' goes high, S'' stays low and S effectively stays low.

At t5 clock pulses C and $\overline{C}$ once again switch. However, the data input signal A is assumed to be held at a low level (with a "1" being stored, that is, S also being at a low level). C goes low, transistor 130 turns off and transistor 140 turns on such that S' goes low. $\overline{C}$ turns transistor 220 on causing transistor 240 to turn off and S'' to go high. S' and S'' compensate such that S is held low. Similarly at t6 when C and C switch back to their normal state, S' and S'' again switch and S is still held low.

Sometime between t6 and t7, it is assumed that the data input signal A switches from a low to high state. When clocks C $\overline{C}$ shift at t7, transistor 120 is held on by signal A and transistor 140 does not turn on. Therefore, signal S' is held high. C turns transistor 220 on, causing transistor 240 to turn off and signal S'' to go high. Therefore, the output signal S of register 1000 shifts to a high state. At t8 signals C and $\overline{C}$ switch back to their normal state and the system is back to the status explained corresponding to time t0.

the reset signal R has the following effect. Reset signal R is assumed to be normally low and therefore transistor 225 is off and has no efect on the operation of the circuit. When the output signal S'' of gate 200 is high, transistor 230 is on and transistor 240 is off. In such a state, the shifting of R to a high condition will cause transistor 225 to also turn on but has no affect on output signal S'', since transistor 240 is already off. In other words, the latch mechanism is not affected. However, if output signal S'' of gate 200 is low (that is, transistor 240 is on and transistor 230 is off), then reset signal R has an affect on the latch. Specifically, when R goes high, transistor 225 is turned on causing transistor 240 to turn off and signal S'' to go high. The S'' signal then turns transistor 230 on. When reset signal R returns to a low state, transistor 225 turns off, but current still does not flow through transistor 240 because transistor 230 stays on due to the signal S'' being high. In this manner, the reset signal R resets the latch from a "1" to a "0" storage state.

Figure 2A:
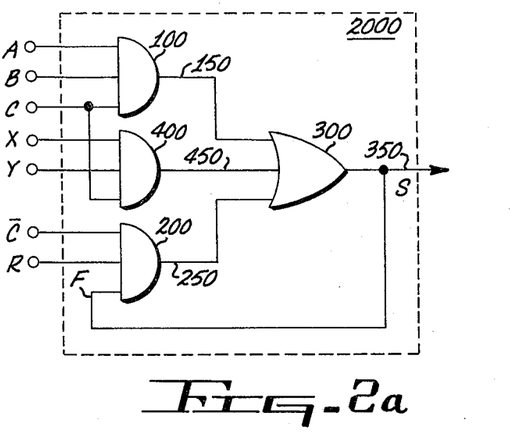
FIG. 2a is a logic diagram of an And/Or latching register of the present invention.

Referring now to FIG. 2a, latching register 2000 is shown. It is noted again that throughout this specification identical labels are used in different drawings to denote equivalent parts. Comparison of register 2000 with register 1000 shows that the difference between the two registers is the addition of AND-gate 400 to register 2000. AND-gaate 400 receives signals from data input lines X and Y and hs an input terminal connected to clock C. The output signal from gate 400 is sent over line 450 to another input terminal of OR-gate 300. The functional difference between register 2000 and register 1000 is that register 2000 comprises an And/Or register. Whereas register 1000 has either a single data input signal A or two data input signals A and B which are ANDed together for storage in latching register 1000, register 2000 has four data input signals A, B, X and Y. A and B are ANDed by AND-gate 200 as are X and Y by AND-gate 400. The c combination of A.B and X.Y are then ORed by OR-gate 300 such that the signal stored and generated by latching gate 2000 is the logical equivalent of A.B.+X.Y.

Figure 2B:
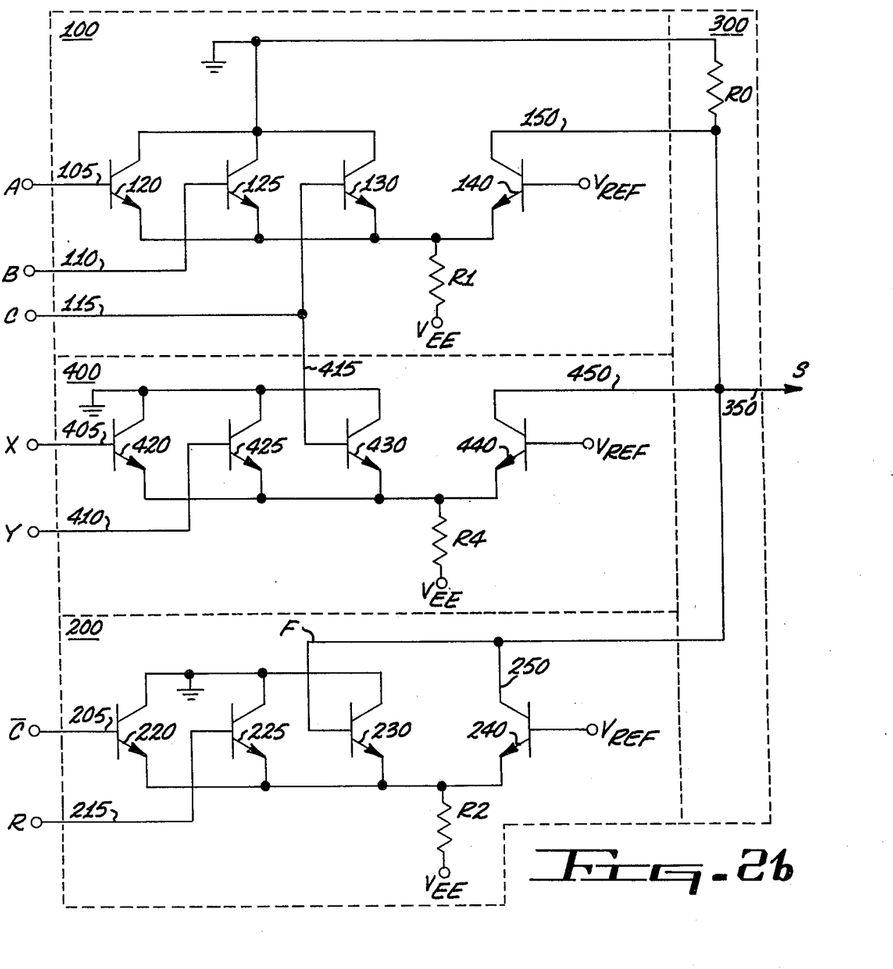
FIG. 2b is a circuit diagram for implementing the And/Or latching register shown in FIG. 2c.

Referring now to FIG. 2b, a circuit diagram for implementing the register 2000 of FIG. 2a is shown. Comparison of FIG. 2b to FIG. 1b shows that blocks 100 and 200 are identical in the two figures. However, FIG. 2b has the additional block 400. Block 400 is identical to block 100 with the exception that lines 405 and 410 couple data input signals X and Y to transistors 420 and 425 respectively, as well as lines 105 and 110 coupling signals A and B to transistors 120 and 125 respectively. Although a timing diagram is not given for FIG. 2b, one of ordinary skill in the art could readily understand its operation given its similarity to FIG. 1b, explained by FIG. 1c. Specifically, FIG. 1c shows a single data input signal A. As described above, the operation of the circuit shown in FIG. 1b is understood if line A of FIG. 1c is interpreted as A.B. of FIGS. 1a and 1b. Therefore, the circuit shown in FIG. 2b is understood if line A of FIG. 1c is interpreted as A.B.+X.Y. of FIGS. 2a and 2b.

The design characteristics of the above discussed circuits are essential features of the present invention. Specifically, the circuits of FIGS. 1b and 2b have certain characteristics which should be discussed in additional detail. Each of the gates 100, 200, 400 includes a plurality of input transistors (for example, transistors 120, 125, 130 of gate 100) with their collectors commonly connected. This provides the feature that these transistors may be fabricated within a single "tank" or isolated region under well-known semiconductor fabrication processes. Inclusion of several transistors within a single tank allows for high density circuits. Similarly a single resistor R1 is shared by all of the transistors in gate 100, resistor R2 is shared by all of the transistors of gate 400. An additional high-density feature is the sharing of RO by transistors 140, 240 and 440. Such sharing is an essential design feature which provides the functional requirements of the circuit while simultaneously enhancing the density and power performance of the circuit.

Register systems utilizing the above-discussed circuits are now presented. These register systems comprise 5 and 10-bit parallel storage capacity. However, in general an N-bit register is envisioned where a specific value for N will be the choice of the system designer.

Figure 3:
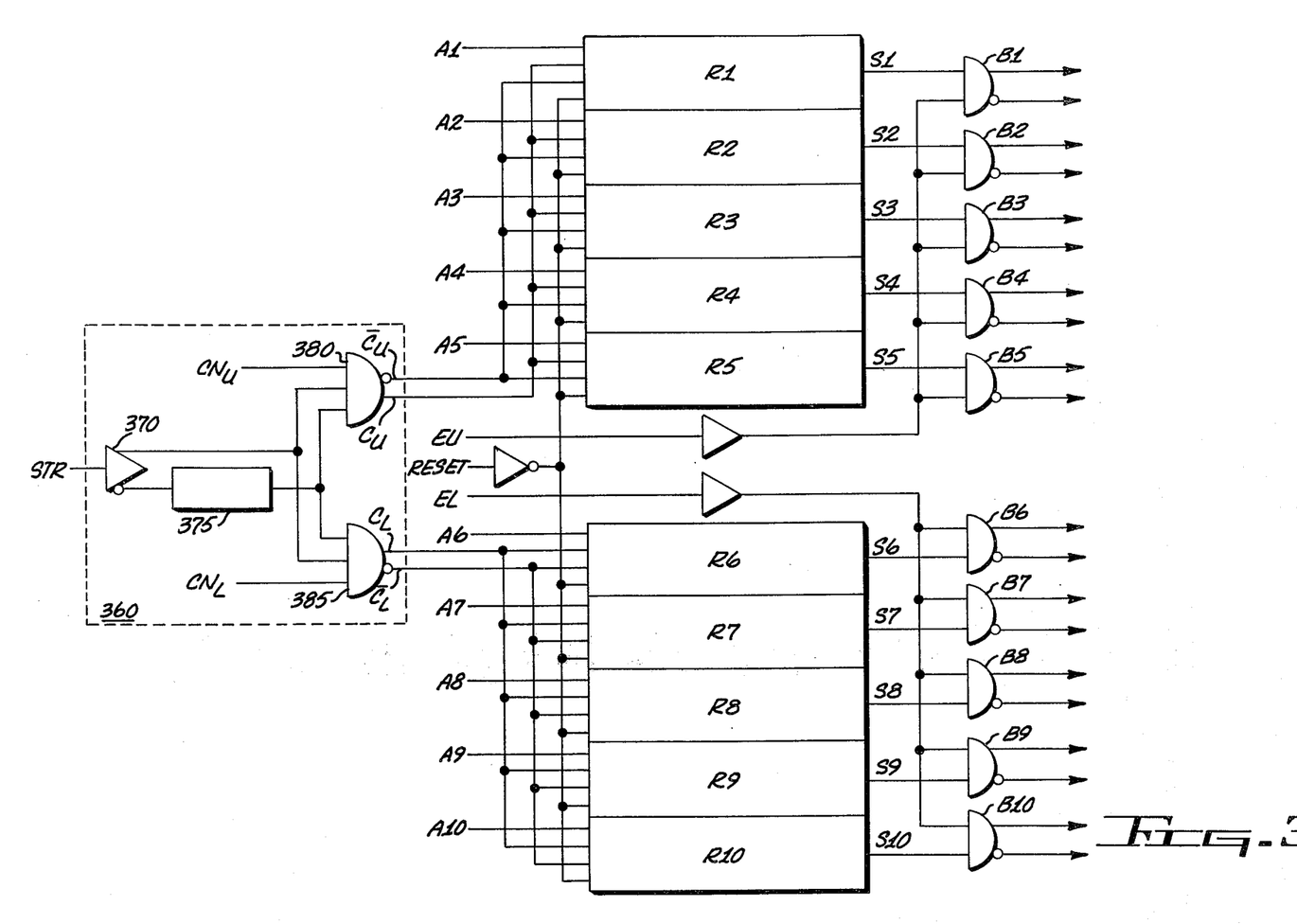
FIG. 3 is a block diagram of a 10-bit parallel storage register system, an embodiment of the present invention.

Referring now to FIG. 3, a ten-bit parallel storage register system is shown. Basic components of FIG. 3 are 10 registers R1 to R10. Each register R1 to R10 is comprised of a circuit identical to FIGS. 1a and 1b (with the exception that the input elements - signal B, line 110 and transistor 125 — are omitted from the circuit). Data input signals to registers R1 to R10 are A1 to A10 respectively. The output signals for the registers are signals S1 to S10 respectively, which are fed into buffer gates B1 to B10 respectively. Buffer gates B1 to B5 are commonly enabled by an upper level amplified enabling signal $E_U$. Lower level buffer gates B6 and B10 are commonly enabled by an amplified enabling signal $E_L$. Outputs from gates B1 to B10 are the equivalent to signal S1 to S10 and their complements. The reset signal for registers R1 to R10 is generated by a system level signal reset gated by an inverting amplifier. In this manner, system reset pulse with its normal state being a "0" and reset state being a "1" is inverted to the requirements of registers 1000 and 2000, discussed above. The inverter complements the signal RESET of FIG. 3 for the characteristics of signal R of FIGS. 1a, 1b, 2a and 2b described above.

Also shown in FIG. 3 is clocking circuit 360. Clocking circuit 360 is comprised of an amplifier 370 connected to a system strobe signal STR. The positive output terminal of amplifier 370 is connected directly to an input terminal of each of gates 380 and 385. The complementary output terminal of amplifier 370 is coupled by a delay 375 to another input terminal of each of gates 380 and 385. Gates 380 and 385 will normally generate a 0 signal when the STR signal is a 0. When the STR pulse goes to a 1, gates 380 and 385 will also go to a 1 until the complementary output signal of amplifier 370, which is delayed by delay 375, changes to a 0. In this manner, the duration of a 1 pulse corresponding to the C signal from gates 380 and 385 will be determined by the time delay of delay 375. Delay 375 may simply be comprised of a plurality of gates, each with a given time constant for its response. The overall delay time for delay 375 will be the summation of the individual delays forming delay 375. Gate 380 also has an upper level control signal $CN_U$ as an input signal. It is also necessary for $CN_U$ to be at a 1 level for gate 380 to generate a 1 signal and for upper level registers R1 to R5 to receive clock pulses $C_U$. Similarly the operation of gate 385 is enabled by lower level control pulse signal $CN_L$. In this manner, the five upper level and five lower level bit registers can be pulsed in parallel. Alternatively, all ten of the registers R1 to R10 may be pulsed in parallel (for example, by commonly connecting control pulses $CN_L$ and $CN_U$). Alternative partitioning of the register system will be obvious to one of ordinary skill in the art.

Figure 4:
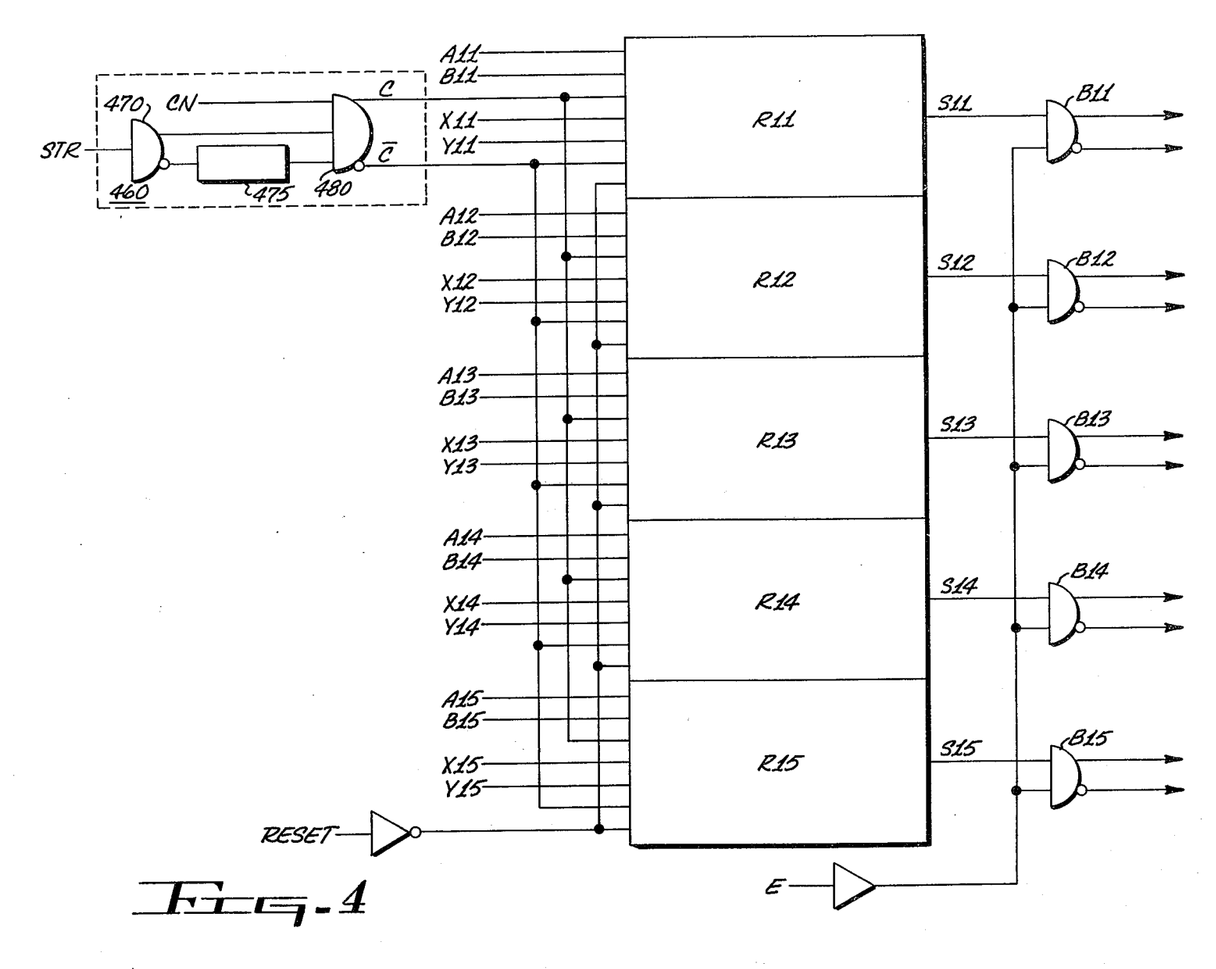
FIG. 4 is a block diagram of a 5-bit And/Or parallel register system, an embodiment of the present invention.

Referring now to FIG. 4, an alternative embodiment of the present invention is shown. FIG. 4 shows a 5-bit And/Or register system. Basic components of the And-/Or register system are registers R11 to R15. Each of registers R11 to R15 is a circuit identical to that shown in FIGS. 2a and 2b with corresponding inputs A11, B11, X11, Y11, etc. Output signals from registers R11 to R15 are signals S11 to S15 which have the following relationship: $S_1 = A_1 \cdot B_1 + Y_1 \cdot Y_1$. Signals S11 to S15 are fed into buffer gates B11 to B15 respectively. Buffer gates B11 to B15 are enabled by the signal E appropriately amplified. The buffer gates B11 to B15 provide at their output terminals the equivalent of signals S11 to S15 and their complements. Registers R11 to R15 have a reset signal sent to them through an inverting gate as described above with respect to FIG. 3. They also have common clock signals C and $\overline{C}$ sent from the complementary output terminals of gate 480 of clock 460. Clock 460 is enabled by strobe signal STR and also includes gate 470 and delay 475. The operation of clock 460 is equivalent to that of clock 360 described above, except gate 480 is enabled by a signal control signal CN.

Figure 5:
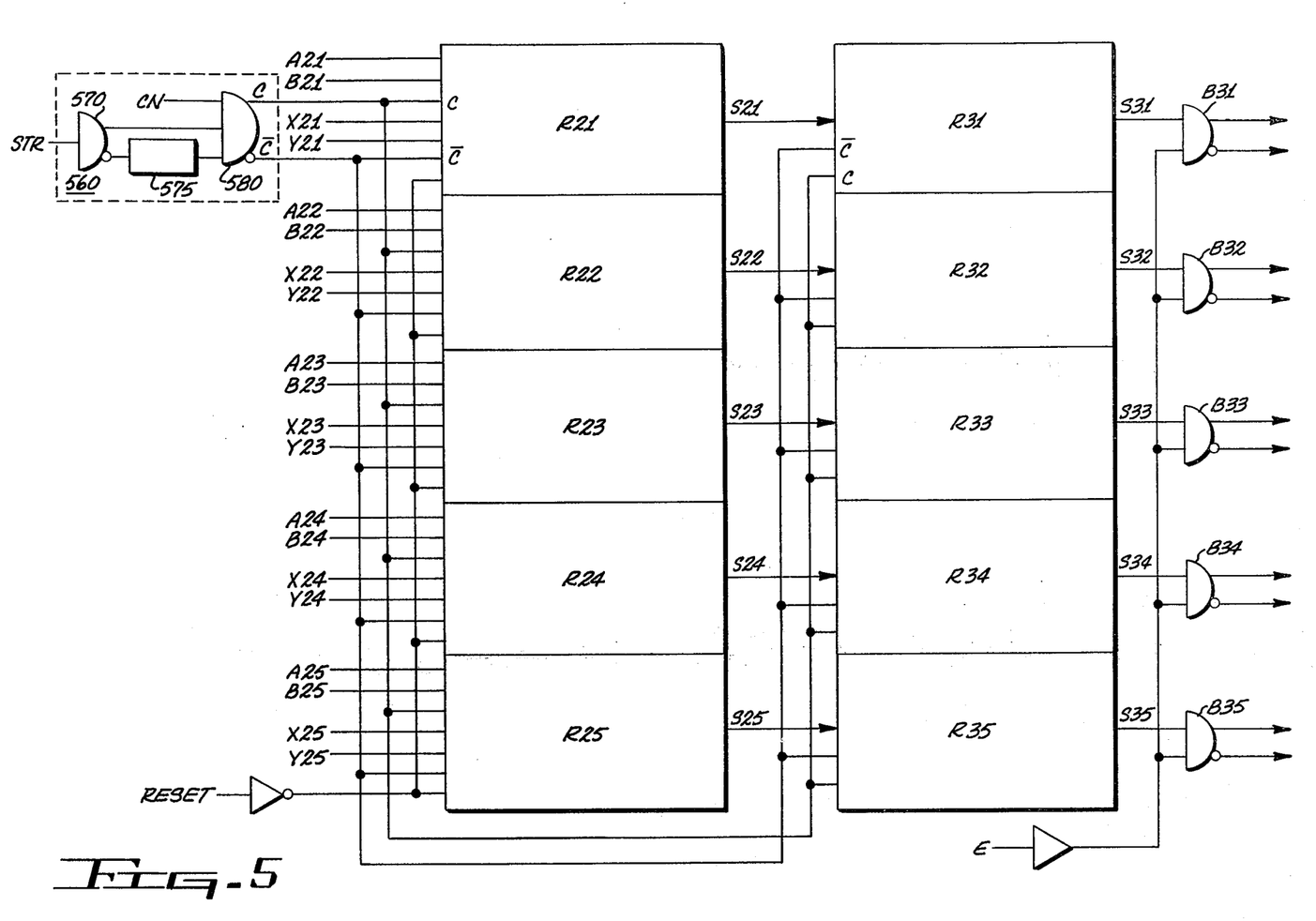
FIG. 5 is a block diagram of a 5-bit And/Or Master Slave parallel register system, an embodiment of the present invention.

Referring now to FIG. 5, 5-bit And/Or Master/Slave register system is shown. Basic components of this register system are registers R21 to R25, each of which is composed of a register circuit identical to that shown in FIG. 2b. The register system is also comprised of registers R31 to R35, each of which is equivalent to the circuit shown in FIG. 1b. Registers R21 to R25 provide output signals S21 to S25 respectively, which have the following relationship with respect to their input signals: $S_I = A_I \cdot B_I + X_I \cdot Y_I$. Registers R21 to R25 are responsive to a reset signal sent through appropriate inverting amplifying means and are also responsive to clock 560 which is identical to clock 460. Registers R31 to R35 have output signals S31 to S35 respectively fed into buffer gates B31 to B35 respectively. Buffer gates B31 to B35 are commonly enabled by a suitably amplified enabling signal E and provide at their output terminals the equivalent of signals S31 to S35 and their complements. The data input signals for registers R31 to R35 are the output signals S21 to S25 from registers R21 to R25. Clock signals for registers R31 to R35 are also provided by clock 560. However, it is noted that whereas registers R21 to R25 have clock signals C and $\overline{C}$ such that the C signal is fed into the AND-gates 100, 400 and the $\overline{C}$ signal is fed into the reset gate 200, registers R31 to R35 have signal C fed into their reset gates 200 and the signal $\overline{C}$ is fed into their data input gates 100. This inverted pulse generation scheme provides an essential feature of the present invention.

Figure 6:
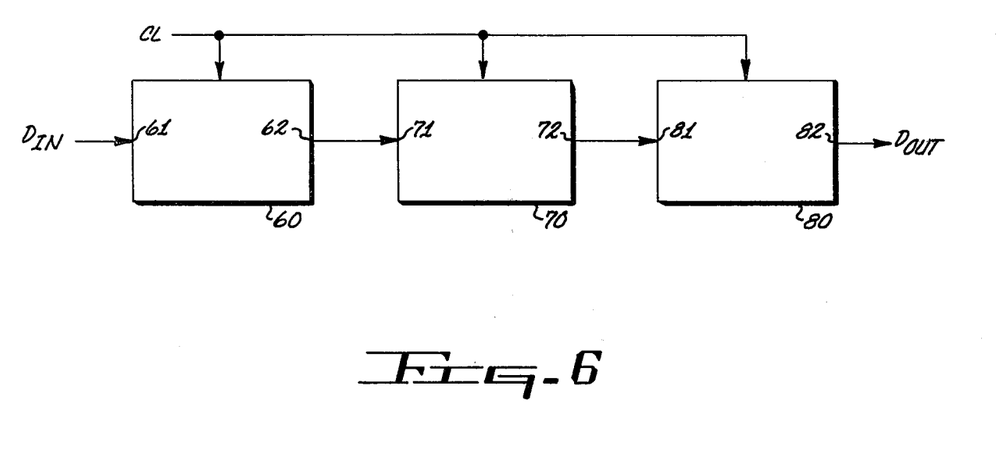
FIG. 6 is a block diagram of a 3-bit shift register.

The master/slave register shown in FIG. 5 provides a delay between storing the input signals to registers R21 to R25 and providing output signals from buffers B31 to B35. This is a requirement for providing a register which can be used as a component in a serial shift register as explained with reference to FIG. 6. Referring now to FIG. 6, a 3-bit serial (or shift) register is shown. This serial register is comprised of individual bit registers 60, 70 and 80. Bits 60, 70 and 80 are enabled by clock signals CL and have input and output terminals 61 and 62, 71 and 72, 81 and 82 respectively. The input data signal $D_{IN}$ to the shift register is sent to terminal 61 and the output signal $D_{OUT}$ from the 3-bit shift register is sent from terminal 82. The timing problem presented by the 3-bit shift register of FIG. 6 (which is typical of an N-bit shift register) is as follows: Clock signals enable a change in the data stored in each of cells 60, 70, 80. The data $D_{IN}$ present at an input terminal 61 will be stored in cell 60 during each cycle. It is desired to transfer data from cell 60 to cell 70, from cell 70 to cell 80 and from cell 80 out as signal $D_{OUT}$ during each cycle. To accomplish this, the old data stored in cells 60, 70, 80 (i.e. the data stored during the previous cycle) must be present and held at output terminals 62, 72, 82 for transmission to cell 70, 80 and outward during each cycle. If the output from cell 60 changes before cell 70 "latches" the data from the previous cycle, the data $D_{IN}$ will be stored in cell 70 as well as cell 60 and the old data stored in cell 60 will be lost. The same problem is posed between cells 70 and 80 as well as any two consecutive cells in a shift register. In other words a shift register simply comprised of registers such as register 1000 or 2000 described above, would not function properly due to timing problems. It is required, therefore, to separate the output state of each cell of the shift register from the input stage, and to hold the output stage at a state corresponding to the previous cycle for a duration sufficient to allow a latching of the old data in the successive cell.

Referring once again to FIG. 5, the Master/Slave register system comprised of a combination of registers 1000 and 2000 with a pulse generating system solves this timing problem. Specifically, input signals A21 to A25 are stored in registers R21 to R25, respectively, upon the presence of appropriate stroke STR and control CN signals. At the same time, the data previously stored in registers R21 to R25 (which is the same as that stored in registers R31 to R35), is transferred through buffer gates B31 to B35 to the next register cell. However, when the strobe STR and control CN signals cause clock signals C and $\overline{C}$ to enable input data to be stored in registers R21 and R25, data is not immediately transferred from R21-R25 to R31-R35. Specifically, due to the inverse timing of R31-35 with respect to the timing of R21-R35 (that is, due to their enabling by $\overline{C}$ and C as opposed to C and $\overline{C}$) there is a delay between the storage of the input signals in registers R31 to R35. In this manner, although signals S21 to S25 change to the new input levels, the output signals S31 to S35 are held at levels corresponding to the previous cycle until C and $\overline{C}$ switch back to their normal levels. Accordingly, the amount of time required for the delay in the pulse shape of C and $\overline{C}$ is governed by internal switching characteristics of the gates, both to store data as well as to propagate data. When C and $\overline{C}$ switch from high to low and low to high, respectively, data is stored in master cells R21 to R25 and slave cells R31 to R35, which act as gates holding the values from the previous cycle. When C and $\overline{C}$ switch back to high and low respectively, cells R21 to R25 latch in their new values and cells R31 to R35 switch values to correspond to the new input values.

While the principles of the present invention have now been described with respect to the illustrated embodiments discussed above, there will be obvious to those skilled in the art many modifications in structural arrangement and components used in the practice of the invention without departing from the above-enumerated principles. The true spirit and scope of the present invention is therefore to be limited only by the claims included herein.

What is claimed is:

1. A current mode logic circuit responsive to complementary first and second clock signals for storing a logical AND function of a plurality of input signals, said circuit comprising:
    first, second and third reference voltage means, each of said reference voltage means producing a first, second and third voltage signal, said second voltage signal of a level between said first and said third voltage signals;
    a first transistor with its base coupled to said second reference voltage means;
    a second transistor with its base connected to receive said first clock signals;
    a plurality of other transistors, each of said other transistors having its base connected to receive one of said plurality of input signals, the collectors of said second and said other transistors commonly connected to said first reference voltage means;
    first resistive means commonly connecting the emitters of said first, second and other transistors to said third reference voltage means;
    a third transistor with its base connected to said second reference voltage means;
    a fourth transistor with its base connected to receive said second clock signals;
    a fifth transistor with its base connected to the collector of said third transistor, the collectors of said fourth and fifth transistors commonly connected to said first reference voltage means;
    second resistive means commonly connecting the emitters of said third, fourth and fifth transistors to said third reference voltage means; and
    third resistive means coupling the collectors of said first and said third transistors to said first reference voltage means.

2. The circuit as claimed in claim 1 further comprising:
    a sixth transistor with its base responsive to a reset signal, its collector connected to said first reference voltage means, and its emitter connected by said second resistive means to said third reference voltage means.

3. The circuit as claimed in claim 1 wherein said first reference voltage means corresponds to a ground level and said second reference voltage means is approximately −0.26 volts.

4. A current mode logic circuit responsive to complementary first and second clock signals for storing a logical function of a plurality of input signals, said circuit comprising:
    first, second and third reference voltage means, each of said reference voltage means producing a corresponding first, second and third voltage signal, said second voltage signal of a level between said first and said second voltage signals;
    a first transistor with its base coupled to said second reference voltage means;
    a second transistor with its base connected to receive said first clock signals;
    a first plurality of other transistors, each of said first plurality of other transistors having its base connected to receive one of a first group of said plurality of input signals, the collectors of said first plurality of other transistors commonly connected to said first reference voltage means;
    first resistive means commonly connecting the emitters of said first, second and first plurality of other transistors to said third reference voltage means;
    a third transistor with its base coupled to said second reference voltage means;
    a fourth transistor with its base connected to receive said first clock signals;
    a second plurality of other transistors, each of said second plurality of other transistors having its base connected to receive one of a second group of said plurality of input signals, the collectors of said second plurality of other transistors commonly connected to said first reference voltage means;
    second resistive means commonly connecting the emitters of said third, fourth, and second plurality of other transistors to said third reference voltage means;
    a fifth transistor with its base connected to said second reference voltage means;
    a sixth transistor with its base connected to receive said second clock signals;
    a seventh transistor with its base connected to the collector of said fifth transistor, the collectors of said sixth and seventh transistors commonly connected to said first reference voltage means;
    third resistive means commonly connecting the emitters of said fifth, sixth and seventh transistors to said third reference voltage means; and
    fourth resistive means coupling the collectors of said first, said third and said fifth transistors to said first reference voltage means.

5. The circuit as claimed in claim 4 further comprising:
    an eighth transistor with its base responsive to a reset signal, its collector connected to said first reference voltage means, and its emitter connected by said third resistive means to said third reference voltage means.

6. The circuit as claimed in claim 4 wherein said first reference voltage means corresponds to a ground level and said second reference voltage means is approximately −0.26 volts.

7. A current mode logic register system comprising:

a clock circuit for generating complementary first and second clock signals having a pulse width of fixed duration; and first, second and third reference voltage means, each of said reference voltage means producing a corresponding first, second and third voltage signal, said second voltage signal of a level between said first and said third voltage signals; and a plurality of parallel storage means responsive to said first and said second clock signals and each connected to receive at least one input signal, each of said storage means performing a logical AND operation on said input signals and storing the result of said logical AND operation, each of said storage means comprising:
  a first transistor with its base coupled to said second reference voltage means;
  a second transistor with its base connected to receive said first clock signals;
  a plurality of other transistors, each of said other transistors, having its base connected to receive one of said input signals, the collectors of said second and said other transistors commonly connected to said first reference voltage means;
  first resistive means commonly connecting the emitters of said first, second and other transistors to said third reference voltage means;
  a third transistor with its base connected to said second reference voltage means;
  a fourth transistor with its base connected to receive said second clock signals;
  a fifth transistor with its base connected to the collector of said third transistor, the collectors of said fourth and fifth transistors commonly connected to said first reference voltage means;
  second resistive means commonly connecting the emitters of said third, fourth and fifth transistors to said third reference voltage means; and
  third resistive means coupling the collectors of said first and said third transistors to said first reference voltage means.

8. A circuit as claimed in claim 7 wherein each of said storage means further comprises:
  a sixth transistor with its base responsive to a reset signal, its collector connected to said first reference voltage means, and its emitter connected by said third resistive means to said third reference voltage means.

9. A current mode logic register system comprising:
a clock circuit for generating complementary first and second clock signals having a pulse width of fixed duration;

first, second and third reference voltage means, each of said reference voltage means producing a corresponding first, second and third voltage signal, said second voltage signal of a level between said first and said second voltage signals; and a plurality of parallel storage means responsive to said first and said second clock signals and each connected to receive a plurality of input signals, each of said storage means performing a logical operation on said input signals and storing the result of said logical operation, each of said storage means comprising:
  a first transistor with its base connected to said second reference voltage means;
  a second transistor with its base connected to receive said first clock signals;
  a first plurality of other transistors, each of said first plurality of other transistors having its base connected to receive one of a first group of said plurality of input signals, the collectors of said first plurality of other transistors commonly connected to said first reference voltage means;
  a first resistive means commonly connecting the emitters of said first, second and first plurality of other transistors to said third reference voltage means;
  a third transistor with its base coupled to said second reference voltage means;
  a fourth transistor with its base connected to receive said first clock signals;
  a second plurality of other transistors, each of said second plurality of other transistors having its base connected to receive one of a second group of said plurality of input signals, the collectors of said second plurality of other transistors commonly connected to said first reference voltage means;
  second resistive means commonly connecting the emitters of said third, fourth, and second plurality of other transistors to said third reference voltage means;
  a fifth transistor with its base connected to said second reference voltage means;
  a sixth transistor with its base connected to receive said second clock signals;
  a seventh transistor with its base connected to the collector of said fifth transistor, the collectors of said sixth and seventh transistors commonly connected to said first reference voltage means;
  third resistive means commonly connecting the emitters of said fifth, sixth and seventh transistors to said third reference voltage means; and
  fourth resistive means coupling the collectors of said first, said third and said fifth transistors to said first reference voltage means.

10. The circuit as claimed in claim 9 wherein each of said storage means further comprises:
  an eighth transistor with its base responsive to a reset signal, its collector connected to said first reference voltage means, and its emitter connected by said fourth resistive means to said third reference voltage means.

11. A current mode logic register system comprising:
a clock circuit for generating complementary first and second clock signals having a pulse width of fixed duration;

first, second and third reference voltage means, each of said reference voltage means producing a corresponding first, second and third voltage signal, said second voltage signal of a level between said first and said second voltage signals;

a first plurality of parallel storage means responsive to said first and said second clock signals and connected to receive a plurality of input signals, each of said first plurality of storage means performing a logical operation on said input signals and storing the result of said logical operation, each of said first plurality of storage means comprising:
  a first transistor with its base connected to said second reference voltage means;
  a second transistor with its base connected to receive said first clock signals;
  a first plurality of other transistors, each of said first plurality of other transistors having its base connected to receive one of a first group of said plurality of input signals, the collectors of said first plurality of other transistors commonly connected to said first reference voltage means;

a first resistive means commonly connecting the emitters of said first, second and first plurality of other transistors to said third reference voltage means;

a third transistor with its base connected to said second reference voltage means;

a fourth transistor with its base connected to receive said first clock signals;

a second plurality of other transistors, each of said second plurality of other transistors having its base connected to receive one of a second group of said plurality of input signals, the collectors of said second plurality of other transistors commonly connected to said first reference voltage means; and second resistive means commonly connecting the emitters of said third, fourth, and second plurality of other transistors to said third reference voltage means;

a fifth transistor with its base connected to said second reference voltage means;

a sixth transistor with its base connected to receive said second clock signals;

a seventh transistor with its base connected to the collector of said fifth transistor, the collectors of said sixth and seventh transistors commonly connected to said first reference voltage means;

third resistive means commonly connecting the emitters of said fifth, sixth and seventh transistors to said third reference voltage means; and fourth resistive means coupling the collectors of said first, said third and said fifth transistors to said first reference means; and a second plurality of parallel storage means responsive to said first and said second clock signals and connected to receive at least one input signal, each of said second plurality of storage means comprising:

an eighth transistor with its base coupled to said second reference voltage means;

a ninth transistor with its base connected to receive said second clock signals;

a tenth transistor with its base connected to the collector of said first transistor, the collectors of said ninth and said tenth transistors commonly connected to said first reference voltage means;

fifth resistive means commonly connecting the emitters of said eighth, ninth and tenth transistors to said third reference voltage means;

an eleventh transistor with its base connected to said second reference voltage means;

a twelfth transistor with its base connected to receive said first clock signals;

a thirteenth transistor with its base connected to the collector of said eleventh transistor, the collectors of said twelfth and thirteenth transistors commonly connected to said first reference voltage means;

sixth resistive means commonly connecting the emitters of said eleventh, twelfth and thirteenth transistors to said third reference voltage means; and seventh resistive means coupling the collectors of said eighth and said eleventh transistors to said first reference voltage means.

12. the circuit as claimed in claim 11 wherein each of said first plurality of storage means further comprises:

a fourteenth transistor with its base responsive to a reset signal, its collector connected to said first reference voltage means, and its emitter connected by said fourth resistive means to said third reference voltage means;

and wherein each of said second plurality of storage means further comprises:

a fifteenth transistor with its base responsive to said reset signal, its collector connected to said fifteenth reference voltage means, and its emitter connected by said seventh resistive means to said third reference voltage means.

* * * * *